(12) United States Patent
Yoshida

(10) Patent No.: US 7,348,551 B2
(45) Date of Patent: Mar. 25, 2008

(54) REMOTE-CONTROL LIGHT RECEIVING UNIT AND ELECTRONIC APPARATUS USING THE SAME

(75) Inventor: Hiroshi Yoshida, Hashimoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/313,952

(22) Filed: Dec. 22, 2005

(65) Prior Publication Data
US 2006/0153568 A1 Jul. 13, 2006

(30) Foreign Application Priority Data
Dec. 24, 2004 (JP) ............................ P2004-373017

(51) Int. Cl.
*H01J 5/02* (2006.01)
*H01J 40/14* (2006.01)
*H01J 5/16* (2006.01)
*H01J 3/14* (2006.01)
*H01L 31/0232* (2006.01)
*H04B 10/06* (2006.01)

(52) U.S. Cl. ...................... 250/239; 250/216; 257/432; 398/212

(58) Field of Classification Search ................ 250/216, 250/239; 257/432, 433, 676; 398/212
See application file for complete search history.

(56) References Cited
U.S. PATENT DOCUMENTS
5,591,966 A * 1/1997 Harada et al. .............. 250/239

FOREIGN PATENT DOCUMENTS
| JP | 2001-94124 A |   | 4/2001 |
| JP | 2001094124 A | * | 4/2001 |
| JP | 2001177117 A | * | 6/2001 |
| JP | 2003-304206 A |   | 10/2003 |
| WO | WO 2004077575 A1 | * | 9/2004 |

* cited by examiner

Primary Examiner—Georgia Epps
Assistant Examiner—Suezu Ellis
(74) Attorney, Agent, or Firm—Birch, Stewart, Kolasch & Birch, LLP

(57) ABSTRACT

A remote-control light receiving unit includes a remote-control light receiving unit body having a lens portion, and a light guiding member that guides transmission signal light received from a remote-control transmitter to the lens portion. In the remote-control light receiving unit body, at least a photoelectric conversion device and a signal processing device that processes an electric signal received from the photoelectric conversion device are mounted on a lead frame, and encapsulated in a light permeable resin. The light guiding member has a terminal end surface that emits the transmission signal light toward the lens portion. The light guiding member is disposed with at least a part of the terminal end surface in close contact with the lens portion.

2 Claims, 7 Drawing Sheets

REMOTE-CONTROL LIGHT RECEIVING UNIT AND ELECTRONIC APPARATUS USING THE SAME

This nonprovisional application claims priority under 35 U.S.C. §119(a) on Patent Application No. 2004-373017 filed in Japan on 24 Dec. 2004, the entire contents of which are hereby incorporated by reference.

BACKGROUND OF THE INVENTION

1. Field of the Invention

The present invention relates to a remote-control light receiving unit used for electric home appliances and information communication products (personal computers etc.).

2. Description of the Related Art

In a receiving device for remote control (hereinafter referred to as remote-control light receiving unit) that receives an infrared light signal transmitted from a device for remote control that is called a "remote control transmitter" and so on, a light receiving element [e.g., photodiode chip (hereinafter referred to as PD chip)] receives the infrared light signal transmitted from the remote-control transmitter. Then, various signal processings such as amplification and waveform shaping are executed by a signal control processing device (hereinafter referred to as IC chip) so that remote control of various audio visual apparatuses such as TVs and DVDs or office automation apparatuses such as personal computers is carried out in response to the received signal.

Infrared light signals transmitted from the remote-control transmitter are digital signals. These digital signals are received at a light receiving surface of the PD chip, and the received optical signals are converted to weak electrical signals. The weak electrical signals are amplified by several tens of thousands by an amplifier circuit within the IC chip. A filter circuit [band pass filter (BPF)] extracts signals of necessary frequencies from the amplified electrical signals. Thereafter, the extracted signals are outputted by a detection circuit as digital waveform information similar to the above infrared light signals.

A remote-control light receiving unit of this type is formed by mounting and fixing the PD chip and the IC chip on a lead frame and encapsulating them in a molding resin. As the remote-control light receiving unit, there are a multi-chip type light receiving unit in which the molding resin is externally covered with a metallic case and a multi-chip type light receiving unit in which the inside of the molding resin is covered with a lead frame. In general, a distance of 10 m or more of remote control is required as a function necessary for the remote-control light receiving unit. Signal amplification processing for amplifying a weak electrical signal by several tens of thousands is, however, executed in both of the multi-chip type light receiving parts. Therefore, noise components such as electromagnetic noises that are not signals are also amplified by the amplification circuit, so that the magnitude ratio of the signal to the noise (SN ratio) cannot be secured. Consequently, it becomes impossible to extract only necessary signals. In order to prevent such a phenomenon, electromagnetic shielding is frequently performed by covering the PD chip, IC chip and peripheries thereof with a conductive resin, a metallic shielding case or the like.

It is required that a remote-control light receiving unit to be installed in an apparatus such as a TV or a DVD (digital versatile disk) apparatus (hereinafter simply referred to as "apparatus") be positioned at the front of the apparatus in order to receive the infrared signal from a remote-control transmitter.

In a structure in which a main board is placed so as to extend in a depth direction like the TV and the like, the remote-control light receiving unit may be placed on a sub-board fitted to the main board so as to be positioned at the front of the apparatus, but it is common that the remote-control light receiving unit is placed on the main board to avoid an increase in cost (e.g., JP 2001-94124 A).

In such a case, since the apparatus takes a structure in which the remote-control light receiving unit is set far back from the front of the apparatus, there arises necessity to efficiently transfer a transmission signal from the front portion of the apparatus to a lens portion of the remote-control light receiving unit body. Thus, as taught in JP 2001-94124 A, a light guiding member (light guide) is provided from the front of the apparatus to the remote-control light receiving unit so that transmission signal light that is incident on the front of the apparatus is transferred to the remote-control light receiving unit. The light guiding member is generally an injection molded product using a thermoplastic transparent resin or an infrared light permeable resin. The light guiding member is a separate part from the remote-control light receiving unit.

Next, the structures of the remote-control light receiving unit and the light guiding member will be described with reference to FIGS. 4 to 7A, 7B. In FIG. 4, a PD chip 2 is bonded to a metallic lead frame (Iron lead frames are the mainstream. The metallic lead frame will be hereinafter simply referred to as "lead frame") 1 with an insulative adhesive 3, while an IC chip 4 is bonded with a conductive adhesive 5. The PD chip 2 usually has a PN junction structure, and because an inverse voltage is applied to the PD chip in the case of the remote-control light receiving unit, an electric potential occurs at an N electrode on the rear surface side of the chip. Therefore, it is required that an insulating state be kept between the PD chip 2 and a PD chip mounting portion of the lead frame, which portion has a GND potential because of the structure of the lead frame 1, and an epoxy resin containing an insulating filler is used for bonding the lead frame 1 and the PD chip 2.

On the other hand, since a signal processing is executed on a surface of the IC chip 4, its rear surface is irrelevant to the signal processing. Thus, bonding to the lead frame 1 may be done with either of the conductive adhesive 5 or the insulative adhesive 3. Usually, the conductive adhesive (an adhesive prepared by mixing Ag powder with an epoxy resin and the like) 5 is used. An electrode of the PD chip 2, an electrode 6 of the IC chip 4 and an input/output lead 7 of the lead frame 1 are connected to one another with a gold wire (hereinafter referred to as Au wire) having a diameter of tens of micrometers 8. Similarly, the IC chip 4 and other input/output leads 7 are connected to one another with Au wires.

The PD chip 2 and the IC chip 4 mounted on the lead frame 1 in the above-mentioned manner are encapsulated in a thermosetting resin (hereinafter referred to as a mold encapsulation resin) 9 which is mixed with a dye that transmits infrared light and blocks visible light. Deburring and bar-resin cutting are performed on the lead frame 1 exposed from the mold encapsulation resin 9.

FIG. 6 shows a four-side view of a molded resin product having the mold encapsulation resin 9 in an injection molded state. Referring to FIG. 6, injection molding is performed so that the mold encapsulation resin 9 of the molded resin product is covered with a conductive thermoplastic resin 11 (hereinafter referred to as secondary molding). Tie-bar cutting and soldering are performed on the lead frame 1 exposed from the mold encapsulation resin 9. In this manner, the input/output leads 7 of the lead frame 1 are separated from one another to be individual input/output leads 12. Subsequently, the resultant lead frame goes through a single-piece cutting process whereby a lead frame as a single article is obtained.

A method of installing the thus formed remote-control light receiving unit in an apparatus such as a TV or the like, and a method of transferring incident light will be described below.

FIG. 7A and FIG. 7B respectively show a front elevational view of the apparatus, in which a remote-control light receiving unit is installed, and a cross sectional view taken along line 7B-7B of FIG. 7A. In FIGS. 7A and 7B, a main board 15 is placed so as to extend in a depth direction of the apparatus, and an individual remote-control light receiving unit 16 as shown in FIG. 6 is provided on the main board 15 with its input/output terminals erect. On the other hand, a light receiving window 17 for transmission signal light, which is positioned at the front of the apparatus, is provided in an outer frame (which is a plastic molded product in many cases) 18 of the apparatus. An interspace from the light receiving window 17 to the remote-control light receiving unit 16 is made up for with a light guiding member (light-guide) 19 so that the transmission signal light reaches a lens of the remote-control light receiving unit 16 from the light receiving window 17.

However, the conventional remote-control light receiving unit has the following problem. That is, since the remote-control light receiving unit 16 is an electric component, it requires to be mounted on a wiring board having a wiring pattern. On the other hand, since the remote-control light receiving unit 16 also must serve as a light receiving component, it requires to be positioned at the front of the apparatus. In order to satisfy both of these conditions, the light guiding member 19 is provided. However, the light guiding member 19 is fitted to the outer frame 18 of the apparatus, and the remote-control light receiving unit 16 is fitted to the main board 15. That is, the light guiding member 19 and the remote-control light receiving unit 16 are provided at different supports. Therefore, positioning accuracy between the light guiding member 19 and the remote-control light receiving unit 16 tends to be poor.

When displacement between the light guiding member 19 and the remote-control light receiving unit 16 is large, transmission signal light emitted from the light guiding member 19 is not efficiently transferred to the lens portion of the remote-control light receiving unit 16, so that the reach of the transmission signal light from the remote-control transmitter is reduced. Furthermore, if there is a gap between a terminal end portion of the light guiding member 19 and the lens portion of the remote-control light receiving unit 16, the angle of light emitted from the light guiding member 19 may be biased or the light may be dispersed depending on the angle of transmission signal light that is made incident on the light guiding member 19, so that the light is not efficiently emitted toward the lens portion of the remote-control light receiving unit 16. Consequently, the transmission signal light from the remote-control transmitter has a reduced reach.

SUMMARY OF THE INVENTION

It is an object of the present invention to provide a remote-control light receiving unit that can efficiently transfer transmission signal light incident on a light guiding member from a remote-control transmitter to a lens portion of the unit.

In order to accomplish the above object, a remote-control light receiving unit according to the present invention includes:

a remote-control light receiving unit body in which at least a photoelectric conversion device that converts an optical signal into an electrical signal and a signal processing device that processes the electrical signal from the photoelectric conversion device are mounted on a lead frame, and encapsulated in a light permeable resin;

a lens portion provided at the remote-control light receiving unit body and focusing incident light at the photoelectric conversion device; and a light guiding member that guides transmission signal light received from a remote-control transmitter to the lens portion; wherein the light guiding member has a terminal end surface that emits the received transmission signal light toward the lens portion, and the light guiding member is disposed with at least a part of the terminal end surface in close contact with the lens portion such that transfer efficiency of the transmission signal light guided from the light guiding member to the lens portion is improved.

With the above construction, at least a part of the terminal end surface of the light guiding member that guides incident transmission signal light to the lens portion is in close contact with the lens portion. Therefore, the transmission signal light emitted from the terminal end surface of the light guiding member can efficiently be transferred to the lens portion. That is, according to the present invention, a reduction in the reaches of the transmission signal light from the remote control transmitter can be suppressed as much as possible.

In one embodiment, the light guiding member and the remote-control light receiving unit are integrally formed, and the entire terminal end surface of the light guiding member is in close contact with the lens portion.

According to this embodiment, the transmission signal light emitted from the terminal end surface of the light guiding member is transferred to the lens portion efficiently.

In one embodiment, the remote-control light receiving unit has a light shielding layer that covers an outer peripheral surface on at least a terminal end surface side of the light guiding member and an outer peripheral surface of at least the light permeable resin of the remote-control light receiving unit body.

In the embodiment, the transmission signal light that is transferred within the light guiding member is prevented from leaking through the outer peripheral surface of the light guiding member to the outside, and transfer of the transmission signal light is efficiently performed.

In one embodiment, conductive substance is mixed into the light guiding member.

According to the embodiment, the light guiding member is provided with conductivity, so that a pillar shaped conductor can be disposed in a region from the apparatus in which the remote-control light receiving unit is installed to the front of the lens portion. Therefore, resistance to electromagnetic noises can be improved.

In one embodiment, a light reflection layer is provided between the light guiding member and the light shielding layer. Preferably, the light reflection layer may be in close contact with the light guiding member and the light shielding layer.

According to the embodiment, the light reflection layer and the light shielding layer are formed around the outer peripheral surface of the light guiding member. Therefore, the reflectance of transmission signal light on the outer peripheral surface of the light guiding member can be improved, thus making it possible to perform efficient transfer to the lens portion of the transmission signal light transferred within the light guiding member.

In one embodiment, the remote-control light receiving unit includes a light shielding and reflection layer that covers an outer peripheral surface on at least a terminal end surface side of the light guiding member and an outer peripheral surface of the light permeable resin. The light shielding and reflection layer may preferably in close contact with the outer peripheral surface of the light guiding member and the outer peripheral surface of the light permeable resin.

According to this embodiment, a layer having a light shielding effect and a layer having light reflectivity are combined into one layer. Therefore, the number of manufacturing steps is reduced to achieve cost reduction.

In an electronic apparatus according to the present invention, the above remote-control light receiving unit of the invention is used.

With the above construction, due to the use of the remote-control light receiving unit that is able to efficiently transfer transmission signal light from the remote-control transmitter to the lens portion, a reduction in the reach of the transmission signal light from the remote-control transmitter can be suppressed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will be described in detail below based on the embodiments illustrated in the attached drawings.

First Embodiment

Figure 1:
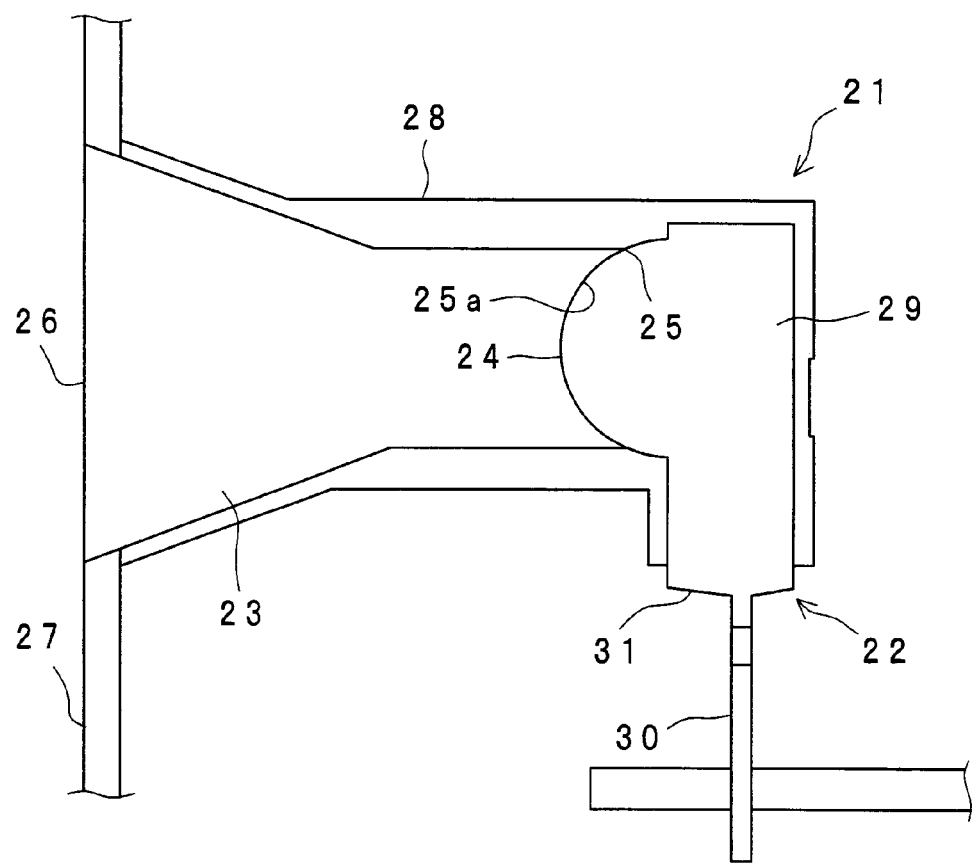
FIG. 1 is a longitudinal cross sectional view of a remote-control light receiving unit according to a first embodiment of the present invention.
Figure 5:
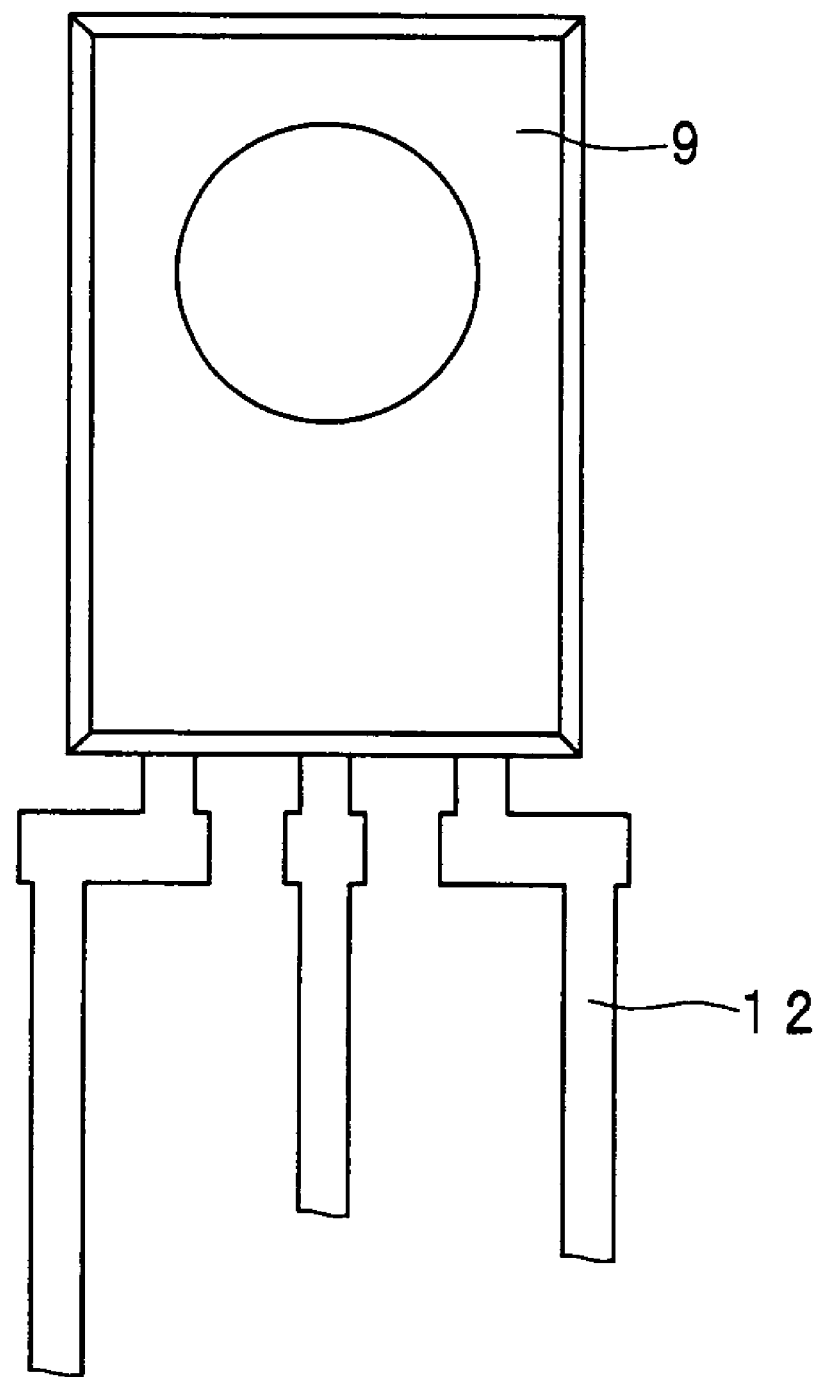
FIG. 5 is a view showing a state in which the PD chip and the IC chip mounted on the lead frame are encapsulated in a mold resin.
Figure 6:
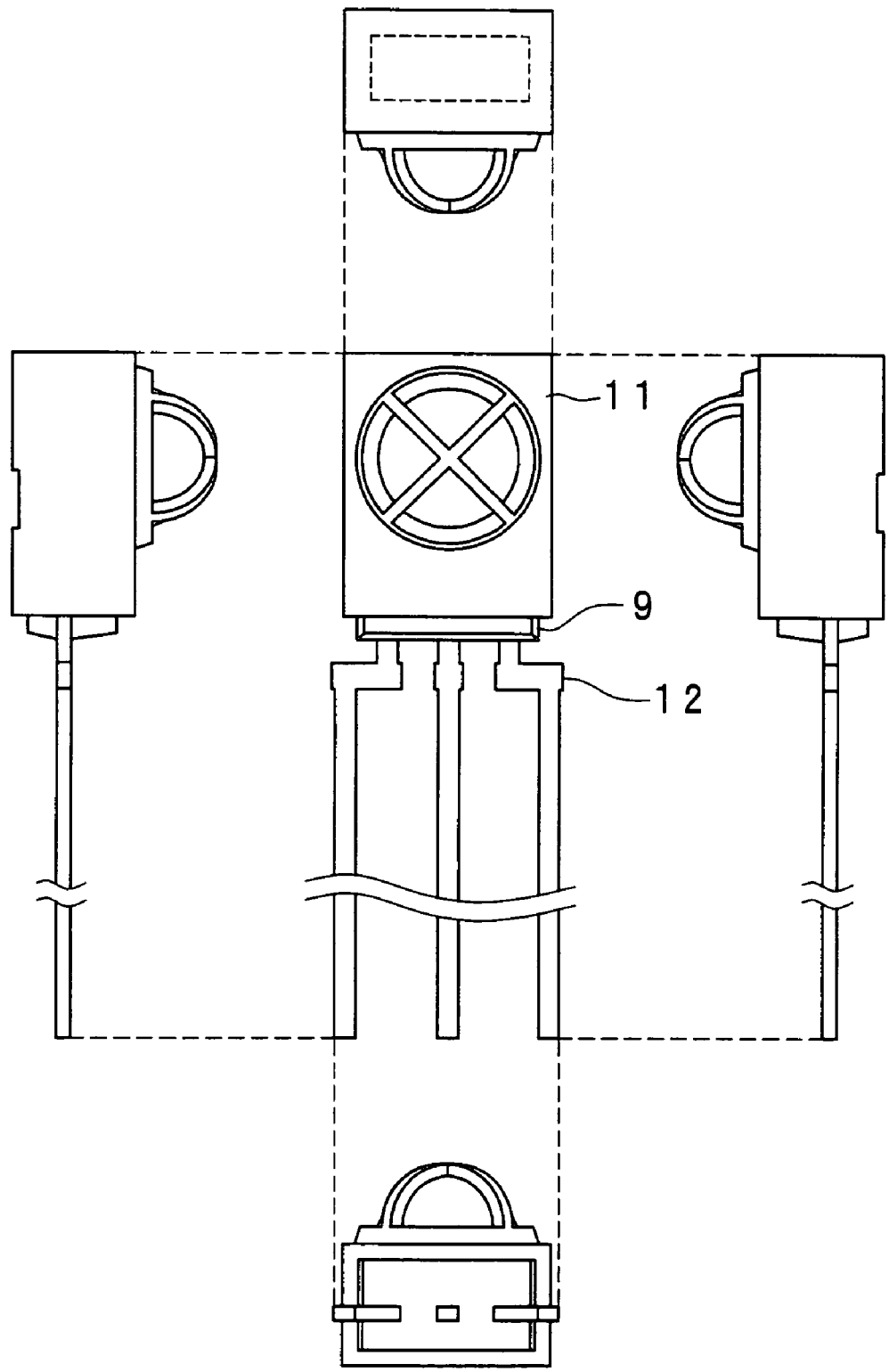
FIG. 6 is an explanatory illustration of secondary molding for a molded resin product.
Figure 7A:
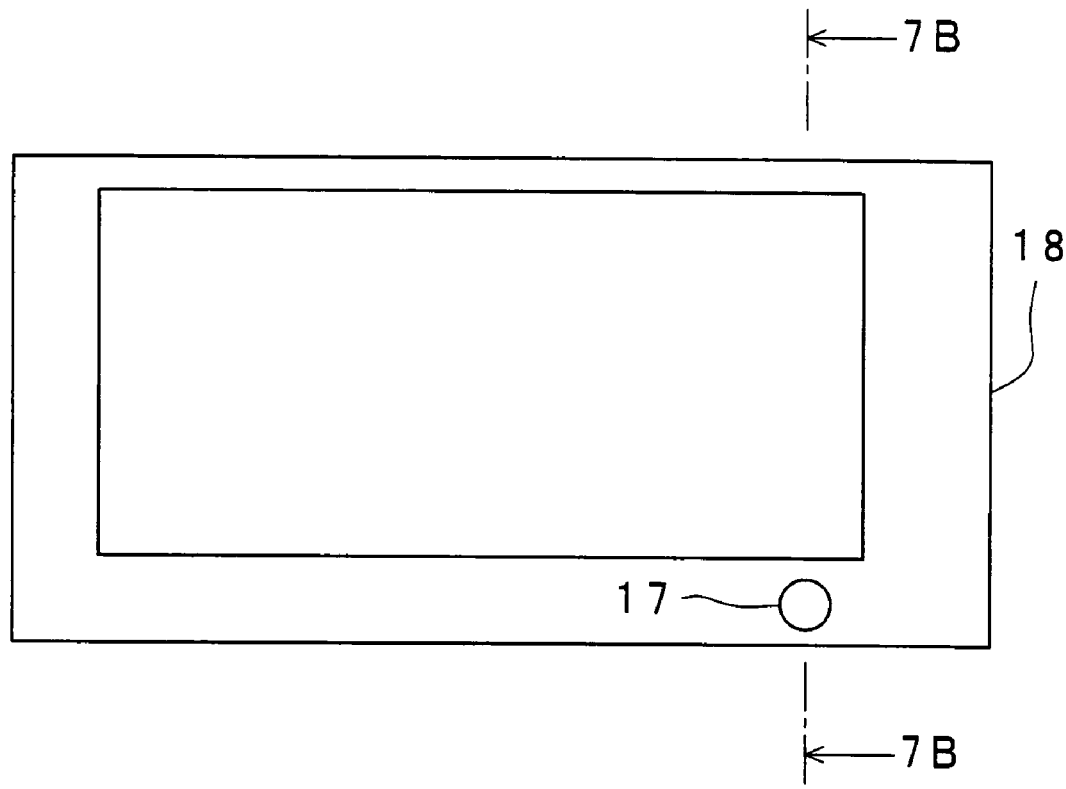
FIG. 7A and FIG. 7B are a front elevational view of an apparatus in which a conventional remote-control light receiving unit is installed, and a cross sectional view taken along line 7B-7B of FIG. 7A, respectively, which explain installation of the remote-control light receiving unit in an apparatus.
Figure 7B:
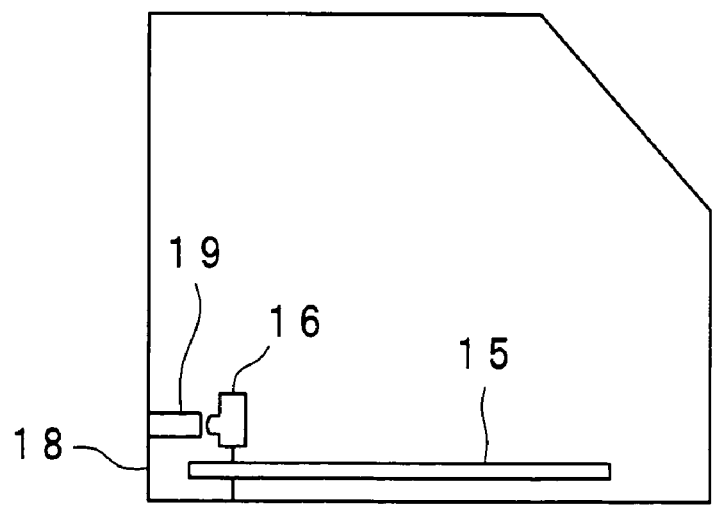

FIG. 1 shows a longitudinal cross sectional view of a remote-control light receiving unit according to an embodiment of the present invention. This remote-control light receiving unit 21 includes a remote-control light receiving unit body 22 having a lens portion 24, and a light guiding member 23 fixed to and in close contact with the remote-control light receiving unit body 22. The remote-control light receiving unit body 22 is of the same structure as the single remote-control light receiving unit as shown in FIG. 5 and thus illustration and description of its internal structure will be omitted.

The light guiding member 23 has a shape of combined circular cylinder and cone, more specifically truncated cone. A diameter at a terminal end portion 25 of the circular cylinder portion is the same as or smaller than a diameter at a base of the remote-control light receiving unit lens portion (hereinafter simply referred to as lens portion) 24 at the front of the remote-control light receiving unit body 22. The light guiding member 23 is disposed in a state in which the terminal end portion 25 is in close contact with the front of the lens portion 24. The reason why the diameter at the terminal end portion 25 of the light guiding member 23 is the same as or smaller than the diameter at the base of the lens portion 24 is to ensure that the entirety of a terminal end surface 25a of the light guiding member 23 is in close contact with the front of the lens portion 24 so that light emitted from the terminal end surface 25a is made incident on the lens portion 24 without loss. If the diameter at the terminal end portion 25 is larger than the diameter at the base of the lens portion 24, light from the light guiding member 23 will be emitted also to regions other than the lens portion 24, that is, there will be light that is not condensed by the lens portion 24. Therefore, there occurs loss in the transfer of transmission signal light.

Contrary to that, the entrance side of the light guiding member 23 spreads conically, which increases an area of its entrance portion 26, so as to be able to take in as much transmission signal light (infrared light) as possible. Because the design of the apparatus should be considered, the entrance portion 26 cannot be blindly made larger, but making the area larger as far as the design layout permits can increase the reach of the transmission signal light from the remote-control transmitter because the absolute amount of light received increases.

The shape of the light guiding member 23 from the entrance portion 26 toward the terminal end portion 25 is a generally conical shape in which the area at the entrance portion 26 is large and that at the terminal end portion 25 is small, but the above shape may be changed to a straight shape or a branching shape for convenience of retention of the light guiding member 23 or sharing with other parts. However, if the number of branches increases, the leakage rate of light may increase and therefore, it is preferable not to perform branching if possible.

As a material of the light guiding member 23, thermoplastic resins (such as polycarbonate, acrylic, etc.) and epoxy resins that transmit infrared light may be used. A resin having flexibility such as urethane may also be used such that the unit is easily fitted in an outer frame 27 of the apparatus. The light guiding member 23 contains conductive substances.

The periphery of the light guiding member 23 is provided with a light shielding layer 28. As will be also described below in connection with the producing method, the light shielding layer 28 is in close contact with the light guiding member 23. As a material of the light shielding layer 28, a thermoplastic resin (polycarbonate etc.) having a light shielding effect and conductivity is used. Alternatively, similarly to the case of the light guiding member 23, a resin having flexibility may be used such that the unit can be easily fitted in the frame of the apparatus. Forming the light shielding material on the periphery of the light guiding member 23 as described above produces the effect that transmission signal light that is being transferred within the light guiding member 23 is prevented from being discharged to the outside of the light guiding member 23. Furthermore, a conductive filler is contained in the light shielding layer 28, which improves the resistance to electromagnetic noises.

The light shielding layer 28 has portions that cover surfaces of the remote-control light receiving unit body 22 other than a surface of the lens portion 24 and a surface 31 of a molded portion 29 from which input/output leads 30 protrude (i.e., the covered surfaces being a rear surface, side surfaces, a top surface and a front surface other than the lens portion 24). The portions, of the light shielding layer 28, that cover the periphery of the remote-control light receiving unit body 22 and the portion that covers the light guiding member 23 are molded simultaneously (integral molding).

Incidentally, electromagnetic noises to the remote-control light receiving unit 21 include noises derived from the apparatus itself in which the unit is installed, such as, for example, noises generated from a cathode ray tube of a TV, a compressor of an air conditioner, and the like, and noises derived from devices other than the apparatus, such as a fluorescent lamp stabilizer. In the present embodiment, a lattice-like mesh net made of a metal or other conductive material (not shown) is formed at the front of the lens portion 24 in the remote-control light receiving unit 21, so that the resistance to electromagnetic noises is further increased.

As described above, in the light receiving unit of the present embodiment, the entirety of the terminal end surface 25a is in close contact with the front of the lens portion 24 of the remote-control light receiving unit body 22. Also, the remote-control light receiving unit 21 has the light guiding member 23 having a conical shape open to the incident side of light. The periphery of the light guiding member 23 is covered with the light shielding layer 28 having a light shielding effect and conductivity. Therefore, a large amount of transmission signal light (infrared light) from the remote-control transmitter is introduced in the light guiding member 23, and light emitted from the terminal end surface 25a of the light guiding member 23 is made incident on the lens portion 24 without loss. This can increase the distance the transmission signal light from the remote-control transmitter can reach.

Further, since the pillar-like conductor is formed in the region from the outer frame 27 of the apparatus to the front of the lens portion 24, the resistance to noises is improved, as compared with the structure in which the front of the lens portion 21 is open to space.

Next, a method of producing the light guiding member 23 and the light shielding layer 28 will be described.

As shown in FIG. 5, the PD chip and the IC chip that are mounted on the lead frame are primary molded with a mold encapsulation resin. After bar-resin cutting, injection molding with a conductive resin is performed such that the conductive resin covers the primary molded product. In this way, the light shielding layer 28 is formed. In this case, first, placed is a mold that covers portions of the primary molded remote-control light receiving unit body 22 other than the surface 31, that is firmly attached to the base of the lens portion 24, and that has a cavity open in a trumpet shape toward the front to expose a surface of the lens portion 24. Then, a thermoplastic resin having a light shielding effect and conductivity is injected to make a light shielding layer 28 defining a cavity open in a trumpet shape toward the front from the base of the lens portion 24.

Next, a light permeable thermoplastic resin is injected into the cavity open in a trumpet shape inside of the light shielding layer 28 to mold the light guiding member 23 in close contact with the front of the lens portion 24.

As described above, in the present embodiment, the light guiding member 23 is attached to the front of the lens portion 24 of the remote-control light receiving unit body 22 so as to be united with the lens portion 24. Therefore, displacement between the light guiding member 23 and the lens portion 24 does not occur, and transmission signal light emitted from the light guiding member 23 is efficiently transferred to the lens portion 24.

The order of injection molding the light guiding member 23 and the light shielding layer 28 may be opposite to the above-mentioned order, but if the light guiding member 23 is injection molded first, it is required that the mold be in close contact with not only the front of the lens portion 24 but also a part of the remote-control light receiving unit body 22.

The above-mentioned production method forms the light guiding member 23 and the light shielding layer 28 by injection molding, but other molding methods such as transfer molding may be adopted.

Second Embodiment

Figure 2:
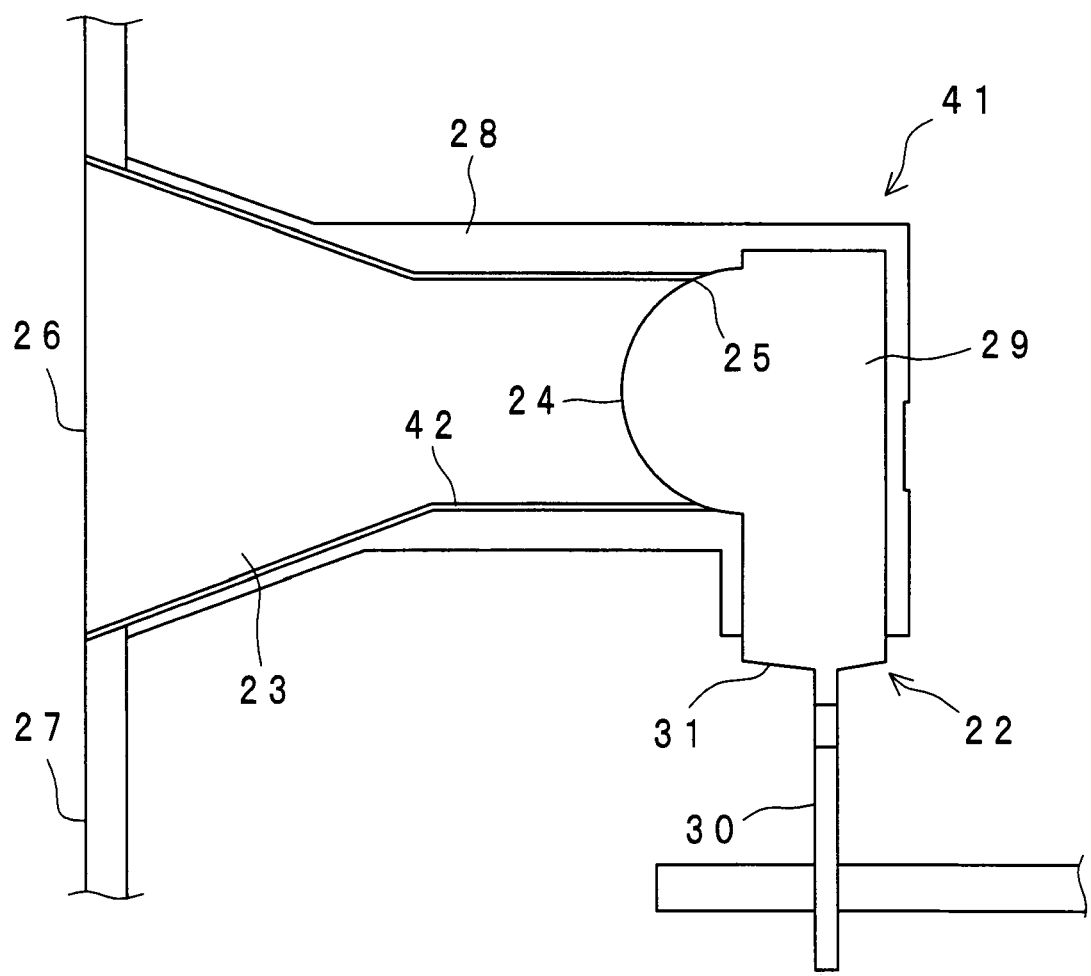
FIG. 2 is a longitudinal cross sectional view of a remote-control light receiving unit according to a second embodiment of the present invention.

In the above-described first embodiment, the light shielding layer 28 is formed directly on the periphery of the light guiding member 23. In a second embodiment, a reflection layer is formed between the light guiding member 23 and the light shielding layer 28, as shown in FIG. 2. In FIG. 2, components same as those of the first embodiment shown in FIG. 1 are designated by the same numerals, and description thereof is omitted.

As described above, a remote-control light receiving unit 41 of the present embodiment has a reflection layer 42 between the light guiding member 23 and the light shielding layer 28, the reflection layer 42 being of a material having a high reflectance (e.g., a silver colored infrared light blocking material). The provision of the reflection layer 42 can enhance the reflection of transmission signal light on the outer peripheral surface of the light guiding member 23. Thus, possible absorption of the transmission signal light by the light shielding layer 28 while it is transferred through the light guiding member 23 is suppressed, so that the efficiency of transfer of the transmission signal light to the lens portion 24 can be improved.

If a black-colored infrared-transmitting light shielding layer 28 having a high light shielding effect or an infrared-absorbing light shielding layer 28 alone is used as in the first embodiment, the reflectance at an interface between the light guiding member 23 and the light shielding layer 28 becomes lower (because light is absorbed by the light shielding film 28). Therefore, the transfer efficiency of transmission signal light is lower and the reach of the transmission signal light from the remote-control transmitter is shorter.

Although the light shielding layer 28 and the reflection layer 42 have been described as being formed of different materials, a light shielding and reflection layer having both the light shielding effect and the reflectivity may be formed using a luster metallic colored (silver etc.) resin that does not transmit infrared light.

Third Embodiment

In both of the remote-control light receiving units 21, 41 of the first and second embodiments, the light receiving unit body 22 and the light guiding member 23 are integrally formed such that they are in close contact with each other. On the other hand, in a remote-control light receiving unit of a third embodiment, a remote-control light receiving unit body and a light guiding member are constructed as separate parts, though they are in close contact with each other.

Figure 3:
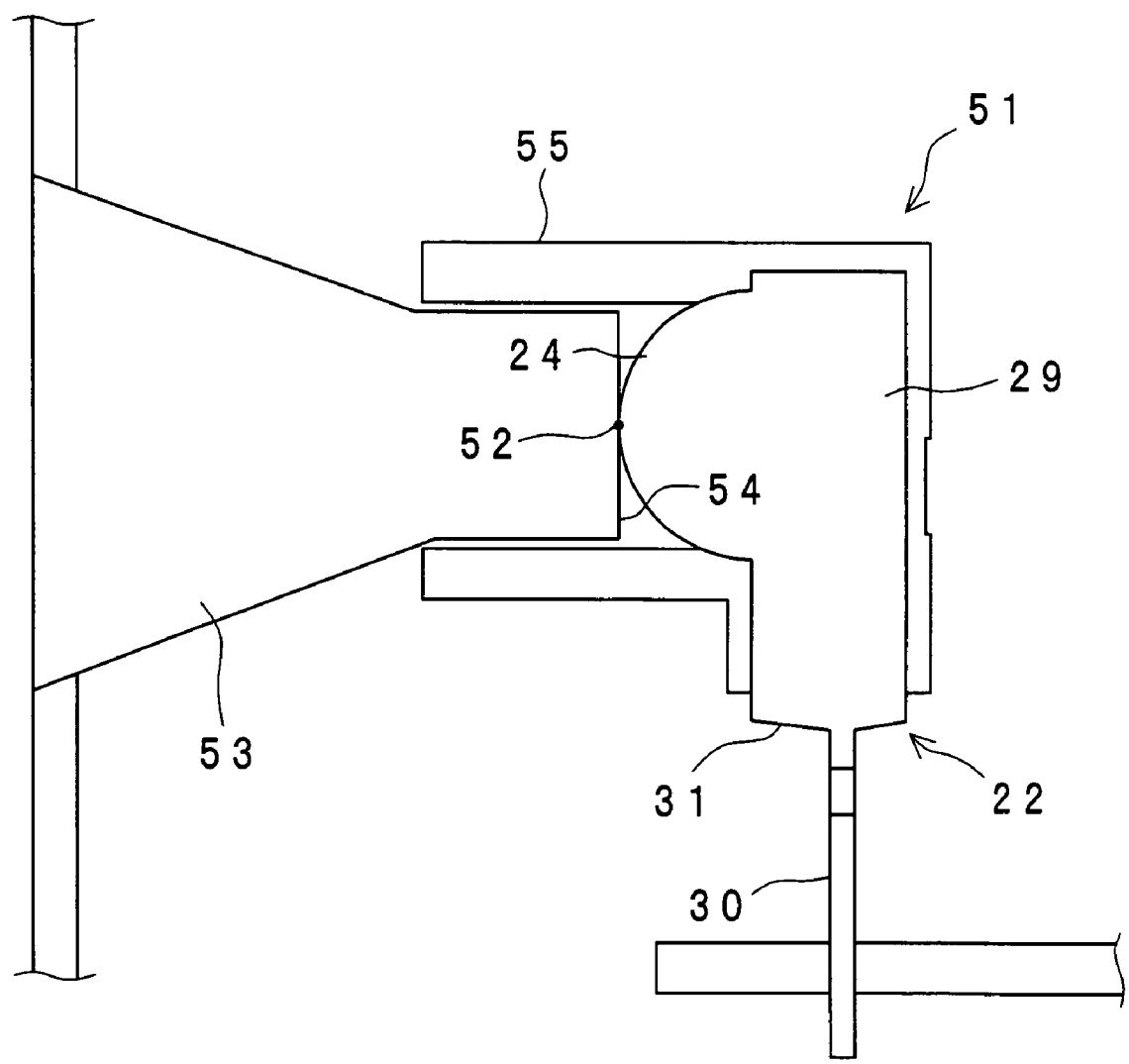
FIG. 3 is a longitudinal cross sectional view of a remote-control light receiving unit according to a third embodiment of the present invention.
Figure 4:
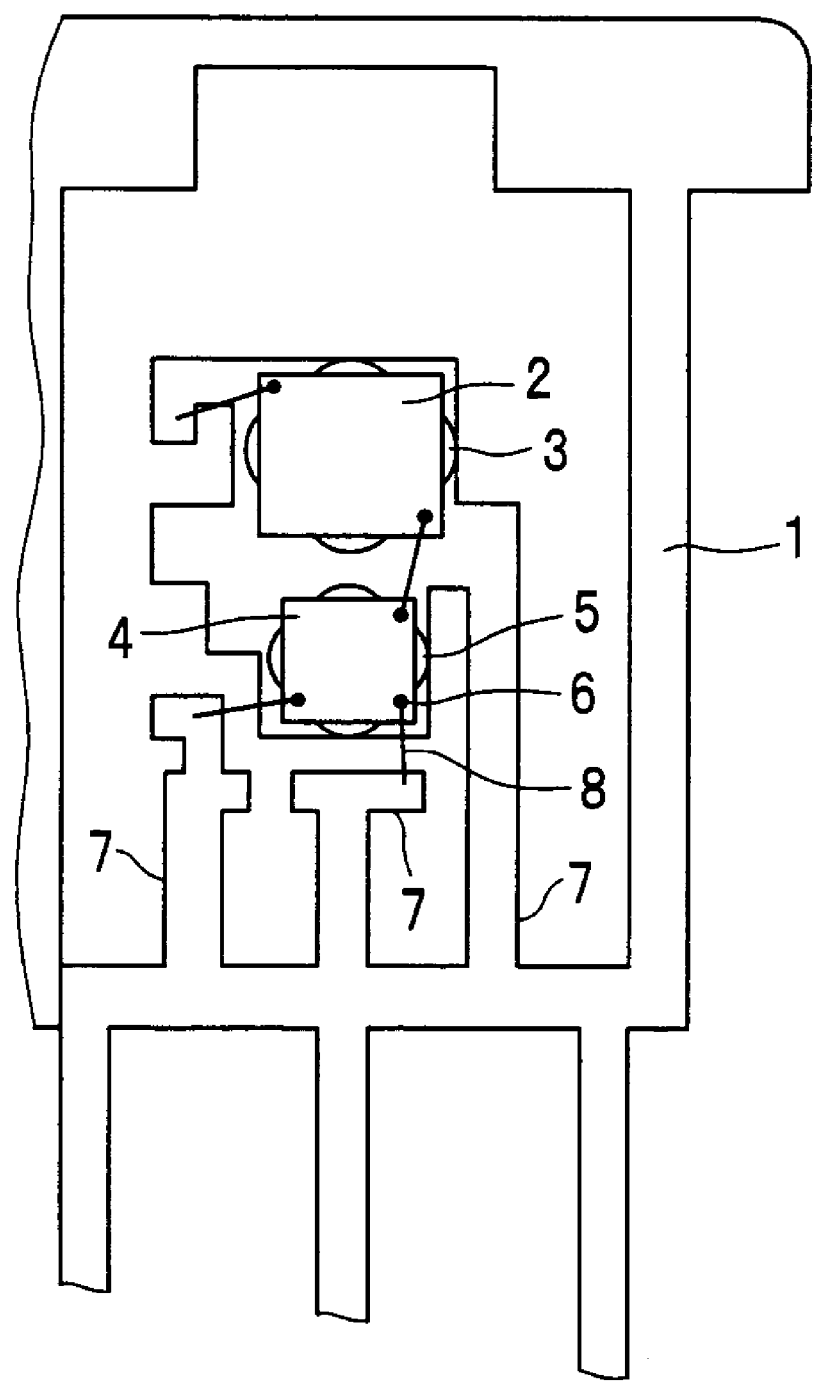
FIG. 4 is a view showing a state in which a PD chip and an IC chip are mounted on a lead frame.

FIG. 3 shows a longitudinal cross sectional view of the remote-control light receiving unit 51 of the third embodiment. In this case also, components same as those of the first embodiment shown in FIG. 1 are designated by the same numerals, and description thereof is omitted.

A terminal end portion 54 of a light guiding member 53 is positioned in contact with or extremely close to an apex 52 of the lens portion 24 of the remote-control light receiving unit body 22. The light guiding member 53 of the present embodiment also has a shape of combined circular cylinder and cone, similar to the light guiding member 23 of the first embodiment shown in FIG. 1, and the terminal end 54 of the light guiding member is an end surface of the circular cylinder.

A light shielding member 55 is placed so as to surround the circular cylinder portion of the light guiding member 53. The light shielding layer 55 consists of a portion that covers surfaces of the remote-control light receiving unit body 22 other than a surface of the lens portion 24 and a surface 31 of a molded portion 29 from which input/output leads 30 protrude (i.e., the covered surfaces being a rear surface, side surfaces, a top surface and a front surface other than the lens portion 24), as in the light shielding layer 28 of the first embodiment shown in FIG. 1. Both of these portions are integrally molded. The light shielding member 55 contains conductive filler.

In the present embodiment, the light shielding member 55 has a circular cylinder shape so as to surround a circular cylinder portion of the light guiding member 53, but it may be formed in a trumpet shape so as also to surround the conical portion of the light guiding member 53

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A remote-control light receiving unit, comprising:
   a remote-control light receiving unit body in which at least a photoelectric conversion device that converts an optical signal into an electrical signal and a signal processing device that processes the electrical signal from the photoelectric conversion device are mounted on a lead frame, and encapsulated in a light permeable resin;
   a lens portion provided at the remote-control light receiving unit body and focusing incident tight at the photoelectric conversion device; and
   a light guiding member that guides transmission signal light received from a remote-control transmitter to the lens portion; wherein
   the light guiding member has a terminal end surface that emits the received transmission signal light toward the lens portion, and the light guiding member is disposed with at least a part of the terminal end surface in physical contact with the lens portion, wherein
   a conductive substance is mixed into the light guiding member.

2. A remote-control light receiving unit, comprising:
   a remote-control light receiving unit body in which at least a photoelectric conversion device that converts an optical signal into an electrical signal and a signal processing device that processes the electrical signal from the photoelectric conversion device are mounted on a lead frame, and encapsulated in a light permeable resin;
   a lens portion provided at the remote-control light receiving unit body and focusing incident light at the photoelectric conversion device; and
   a light guiding member that guides transmission signal light received from a remote-control transmitter to the lens portion; wherein
   the light guiding member has a terminal end surface that emits the received transmission signal light toward the lens portion, and the light guiding member is disposed with at least a part of the terminal end surface in close contact with the lens portion,
   wherein, a conductive substance is mixed into the light guiding member.

* * * * *